United States Patent [19]

Clark

[11] Patent Number: 5,781,392
[45] Date of Patent: Jul. 14, 1998

[54] BALANCED OVERVOLTAGE PROTECTOR FOR A DUAL-WIRE SYSTEM

[75] Inventor: Lowell E. Clark, Scottsdale, Ariz.

[73] Assignee: TII Industries, Inc., Copiague, N.Y.

[21] Appl. No.: 854,844

[22] Filed: May 12, 1997

[51] Int. Cl.⁶ .................................. H02H 9/00
[52] U.S. Cl. .................................. 361/111; 361/91
[58] Field of Search .................. 361/56, 81, 111, 361/119, 126, 127; 257/108, 111, 112, 118, 130, 140, 146, 168

[56] References Cited

U.S. PATENT DOCUMENTS

| 4,641,175 | 2/1987 | Shiraishi | 257/109 |
| 4,748,533 | 5/1988 | Hertrich et al. | 361/56 |
| 5,150,271 | 9/1992 | Unterweger et al. | 361/119 |
| 5,161,183 | 11/1992 | Maytum | 361/119 |
| 5,281,832 | 1/1994 | Clark et al. | 257/109 |
| 5,483,086 | 1/1996 | Ohta | 257/111 |

Primary Examiner—Ronald W. Leja
Attorney, Agent, or Firm—Morgan & Finnegan

[57] ABSTRACT

A balanced overvoltage protector for a dual-wire system comprising a single semiconductor substrate including two breakover thyristors located in sufficiently close proximity so that current in one thyristor effects firing of the other thyristor at a voltage less than its breakover voltage.

9 Claims, 2 Drawing Sheets

BALANCED OVERVOLTAGE PROTECTOR FOR A DUAL-WIRE SYSTEM

BACKGROUND OF THE INVENTION

1. Field of the Invention

This invention relates to transient voltage suppressor devices for reducing the deleterious effects of unwanted electromagnetic pulses, and, more particularly, to balanced transient voltage suppressor devices for use in a dual-wire telephone system.

2. Discussion of the Relevant Art

Many types of transient suppressor devices have been employed in electrical systems for reducing the deleterious effects of unwanted electromagnetic signals. For example, in a telephone system the unwanted signals may comprise lightning strikes or power line voltages. Normal system operation requires voltages up to about 250 volts between two signal wires referenced to a common ground. One type of protection device is a so-called gas tube wherein the device exhibits a breakover from a non-conducting state into a heavily-conducting state at a lower voltage. As the voltage rises across the device, gas ionization is initiated at predetermined breakover voltage above which the voltage drops as the current rises. In the so-called three-electrode gas tube, the breakover voltage between any two electrodes is approximately equal when measured separately, but the breakover voltage at the third terminal is dramatically reduced in the presence of substantial conduction between the other two terminals. In a telephone system this characteristic can lead to balanced protection whereby the voltage on either wire has exceeded the breakover voltage. Gas tubes, however, have the disadvantage that their breakover voltages are difficult to control in manufacture and are subject to dramatic variation as a result of exposure to high-current pulses.

As a result of these disadvantages, there has been a trend toward the use of semiconductor devices for protection of telephone systems. Semiconductor devices known as breakover thyristors exhibit better control over initial breakover voltages and more predictable breakover voltages over life than do gas tubes. However, so far it has been difficult to provide high-current balanced telephone line protection with semiconductor devices at a cost and performance level as good as or better than with gas tube devices.

It is therefore an object of the present invention to provide improved balanced protection with semiconductor devices.

It is another object of the invention to provide improved balanced protection with semiconductor devices by providing a two-wire protector in a common or unitary semiconductor substrate.

It is a further object of this invention to provide improved balanced protection in a two wire system with semiconductor devices by providing a thyristor between each wire and a common wire with means for firing either of said thyristors in response to a current in the other thyristor.

It is yet a further object of this invention to provide improved balanced protection in a two wire system by providing a breakover thyristor between each wire and a common wire with means for firing either thyristor at a voltage below its breakover voltage in response to breakover firing of the other thyristor.

SUMMARY OF THE INVENTION

In accordance with one embodiment of the present invention, there is disclosed a semiconductor transient voltage suppression device having two breakover thyristors in a common semiconductor substrate with each of the two thyristors having a metallic contact for connection to one of two protected wires in a two wire system and merged metallic contact for connecting both of the thyristors to a common wire.

In accordance with another embodiment of the present invention, two breakover thyristors are provided in proximity in a unitary semiconductor substrate so that either of the thyristors will fire at a voltage below its breakover voltage in response to breakover firing of the other thyristor.

In accordance with yet another embodiment of the present invention, two breakover thyristors in a common semiconductor substrate are configured in proximity with means for preferential breakover firing of either thyristor at a location or locations near the other thyristor.

The foregoing and other objects, features, and advantages of the invention will be apparent from the following, more particular description of the preferred embodiments of the invention, as illustrated in the accompanying figures.

DETAILED DESCRIPTION OF THE INVENTION

Figure 1:
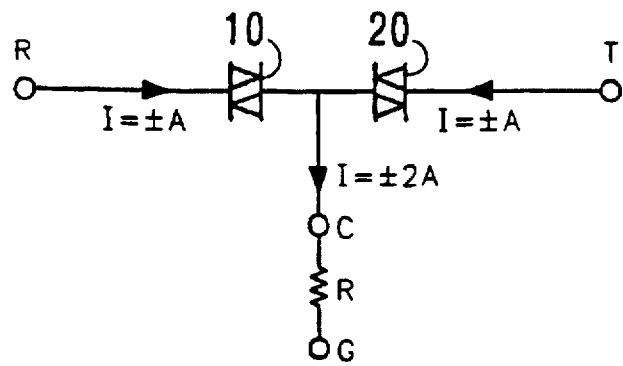
FIG. 1 is a schematic diagram of a prior art two wire protective circuit utilizing two discrete semiconductor breakover thyristors.

Referring now to FIG. 1, a common protection scheme for a two wire system is depicted schematically. In a telephone system, for example, the ring (R) and tip (T) wires carry the signals for normal operation of the system. Such operation requires voltages of both polarities of up to about 250 volts to be present between tip and ring wires as well as between tip or ring and a common (C) terminal of the protector unit which terminal or wire is desirably connected to an earth ground (G). An unavoidable parasitic resistance R, whose value may vary from installation to installation, is present between the common wire terminal (C) of the protector unit and the earth ground (G). This resistance may undesirably affect the operation as will be seen in the ensuing discussion. Elements 10 and 20 are semiconductor breakover thyristors which exhibit negligible current conduction up to a predetermined breakover voltage $V_{BO}$. Once the breakover voltage has been exceeded, the current rises rapidly as the current through the thyristor device increases. The devices 10 and 20 both block and conduct for either polarity of applied voltage. In the protection circuit of FIG. 1, the breakover voltage is selected somewhat above the system operating voltage. $V_{BO}$ for example might be about 300 volts. Thus, when the voltage from either the tip (T) or ring (R) terminal exceeds 300 volts due to an extraneous signal, at least one of the devices 10 or 20 will fire and prevent a sustained overvoltage on the wire which carried the extraneous signal. However, if the extraneous signal is substantially unbalanced between the tip and ring lines, only one of the devices 10 and 20 will fire leaving an undesirably prolonged overvoltage between the tip and ring wires. Even if the undesired transient imposes a nearly equal signal on the two wires to be protected, firing of one of the devices 10 and 20 will result in a current through the resistor R which sets up a voltage which tends to keep the other device from firing. Thus the circuit of FIG. 1 does not always result in balanced protection whereby both the tip and ring wires are clamped to the common wire in the presence of undesirable voltage transients.

Figure 2:
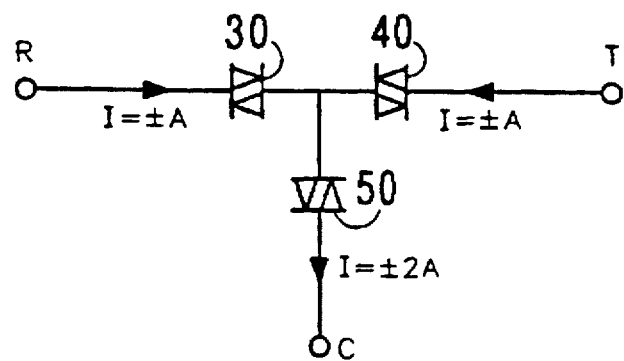
FIG. 2 is a schematic diagram of a prior art two wire protective circuit employing three breakover thyristors for providing improved balanced protection over the circuit of FIG. 1.

Referring now to FIG. 2, another known semiconductor protection scheme for a two-wire system is shown. Here three semiconductor breakover thyristors 30, 40 and 50 are connected in a wye configuration between the tip, ring, and common wires. The breakover voltages of the devices 30 and 40 are approximately equal at value which when summed with the breakover voltage of device 50 is equal to the desired protection voltage. For example, each of the devices 30, 40, and 50 might have a breakover voltage of about 150 volts in order to provide a protection voltage of about 300 volts from either the tip or ring wire to the common wire. If the tip to common voltage exceeded this value, then breakover thyristors 40 and 50 would both fire into their low voltage state so that a spurious signal on the ring wire would only have to exceed the breakover voltage of device 30 plus the on voltage of device 50 in order to fire device 30 and protect the ring line. Thus, as compared with the circuit of FIG. 1, improved balanced protection is achieved but the voltage on the second-to-fire line must be at least about half of the protection voltage.

Figure 3:
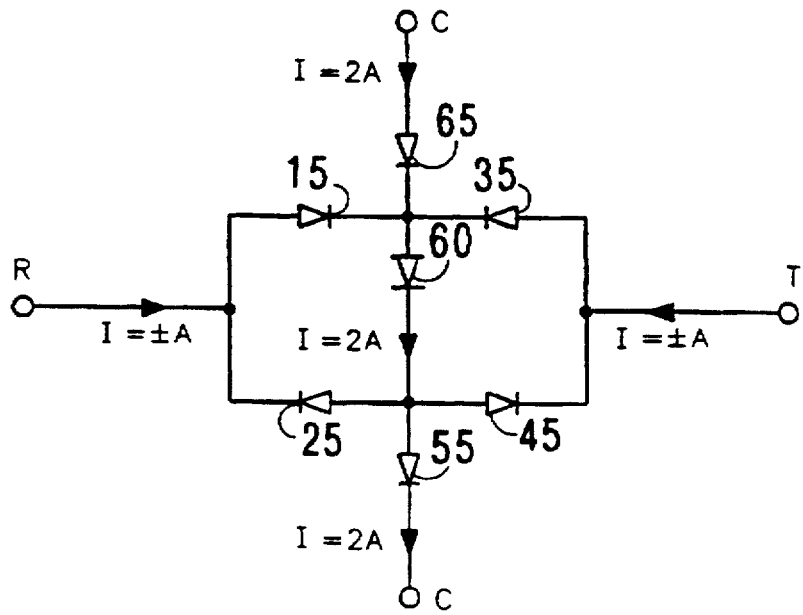
FIG. 3 is a schematic diagram of a prior art protective circuit for a two wire system incorporating one breakover thyristor together with multiple diodes for providing highly balanced protection.

A known circuit for improving the balance with semiconductor devices is shown in FIG. 3. Here a single breakover thyristor 60 is connected between the tip, ring, and common wires through a total of six diodes 15, 25, 35, 45, 55 and 65. Because of the three-phase bridge arrangement of these diodes, breakover thyristor 60 need only block and conduct in one direction. Its breakover voltage is selected as the desired protection voltage for the system, e.g. 300 volts. If the voltage between the ring wire R and the common wire C were raised above this value, device 60 would break over and spurious current would flow through it and diodes 15 and 55 in order to protect the ring wire. Under these conditions the voltage between the tip wire T and the common wire C would only have to exceed the sum of the on voltages of thyristor 60 and diodes 35 and 55 in order to achieve large current flow and thus protect the tip wire T. The circuit of FIG. 3 is thus balanced over a much broader range of voltages than the protectors of either FIG. 1 or FIG. 2. However, the configuration of FIG. 3 is such that it is very difficult to integrate in order to substantially reduce the component count because of the high voltage and high current ratings on each of seven semiconductor devices. The large number of high current interconnections can result in unacceptable reliability of the protector.

Any protection device must protect and survive up to some predetermined current. If the protection ampacity is denoted by the symbol A, then the current which must be handled at either the tip wire T or the ring wire R is plus or minus A while the current in the common wire C can be up to twice that value, as indicated in FIGS. 1–3. Thus, any semiconductor device which is the sole current carrier in the common wire path is required to have twice the ampacity of a device which is the sole current carrier in the tip or ring wire path. Thus, the total required semiconductor ampacity for the configuration of FIG. 1 is 4 A (two devices and two directions per device) while that of the circuit of FIG. 2 is 8 A (two devices 30 and 40 of ampacity A and one device 50 at ampacity 2 A times two direction for each device). Similarly, the total required semiconductor ampacity for the configuration of FIG. 3 is 10 A. Since the ampacity of the semiconductor devices involved is closely proportional to their substrate area, the FIG. 3 protector requires about two and one-half times the semiconductor area of the FIG. 1 protector. And since the cost of a semiconductor device of a given complexity is at least proportional to its area, and the semiconductor device cost is a major if not dominant cost for the protector of FIG. 1, it is not surprising that there is not widespread deployment of the FIG. 3 protector despite its improved balance.

Comparing the protector of FIG. 1 and those of FIGS. 2 and 3 with improved balance, it will be seen that the latter have a breakover thyristor which is shared by the ring-to-common and the tip-to-common current paths. Extra semiconductor elements must then be added to maintain the tip-to-ring blocking voltage, increasing both the cost and the on-state power dissipation. Essentially the cross-coupling between the tip and ring wires is achieved by the voltage collapse of a common serial element on its firing in response to a spurious signal which produces an overvoltage on only one of the wires. If the requisite cross-coupling could be achieved without the need for voltage collapse in a common element, the protector could be substantially simplified. Referring back to FIG. 1, if current flow in device 10, for example, would cause firing of device 20 at a voltage below its breakover voltage, then balance could be achieved with a much lower component count.

Figure 4:
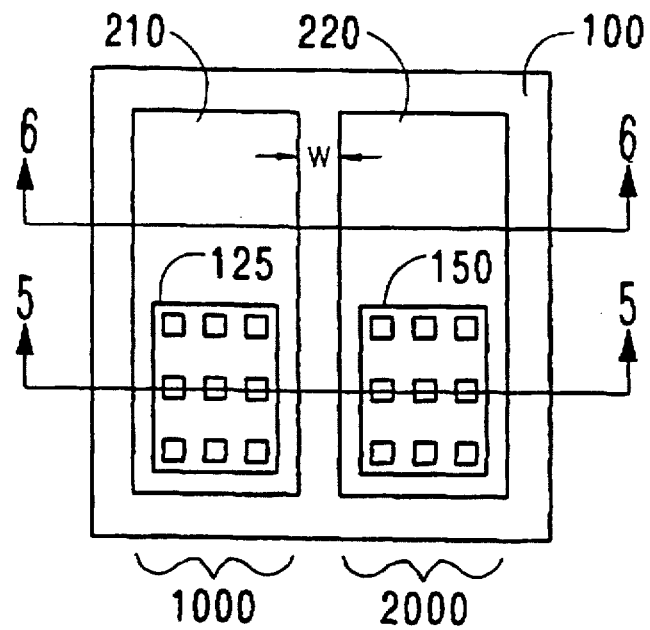
FIG. 4 is a top view of a semiconductor substrate incorporating two breakover thyristors for improved balanced protection according to the present invention.
Figure 5:
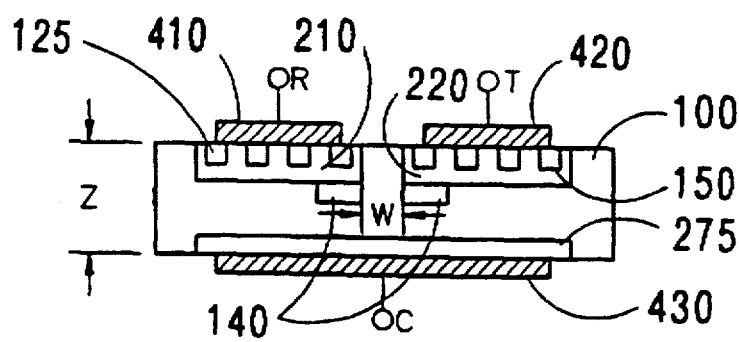
FIG. 5 is a side view in cross-section of a portion of the semiconductor substrate of FIG. 4 and showing means for facilitating cross-coupling of the thyristors.

As will be shown in the following description, such a result may be achieved by placing the two breakover thyristors side-by-side in a common semiconductor substrate. Referring now to FIG. 4, a semiconductor substrate 100 of a first conductivity type is viewed from the top. Semiconductor regions 210 and 220 of a second conductivity type opposite said first conductivity type lie in substrate 100 and comprise anode portions of thyristors. Semiconductor regions 125 and 150 of a first conductivity type lie in each of regions 210 and 220 and comprise cathode portions of thyristors. Referring to FIG. 5, which is a cross-sectional view through a portion of the semiconductor substrate of FIG. 4, it will be seen that the substrate 100 has a thickness Z and region 275 of second conductivity type forms a common anode for first and second breakover thyristors. In FIGS. 4 and 5, the first thyristor 1000 comprises semiconductor regions 125, 210, 100 and 275 of alternating conductivity types while the second thyristor 2000 comprises regions 150, 220, 100 and 275 also of alternating conductivity types. The two breakover thyristors 1000 and 2000 face each other in the common substrate 100 and are laterally separated by a distance W. Metallized regions 410, 420, and 430 provide for conductive connection to the tip, ring, and common wires of the system as shown.

The operation of a structure exemplified by FIGS. 4 and 5 as a balanced overvoltage protector will now be given. If the potential on the ring wire is increased in such a direction that region 210 becomes reverse-biased with respect to substrate 100, then the thyristor 1000 comprising regions 125, 210, 100 and 275 will fire when its breakover voltage is reached. As a result of this firing, excess carriers are injected into substrate 100 in the area proximate region 210. If the distance W is sufficiently small, these excess carriers can cause the firing of thyristor 2000 even though the voltage between the tip wires and the common wire is less than the breakover voltage of thyristor 2000. To achieve such cross-coupling between the thyristors 1000 and 2000 the spacing W should be as small as possible without degrading the blocking voltage between the tip wire and the ring wire. Preferably the spacing W at the location where the thyristors face each other should be less than the thickness Z of the semiconductor 100.

In another embodiment according to the present invention, as shown in FIG. 5, regions 140 of a first conductivity type are added in the semiconductor substrate 100 adjacent to regions 210 and 220 where the two thyristors 1000 and 2000 face each other. Regions 140 locally reduce the breakover voltage of the thyristor so that each one will first fire at a location near the other thyristor. This hastens the turn-on of the second-to-fire thyristor and thus improves the protection balance.

Figure 6:
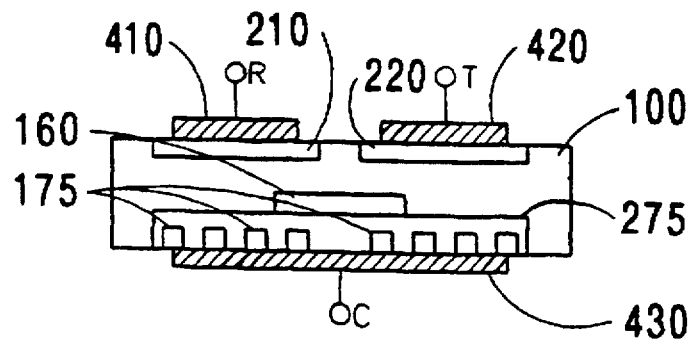
FIG. 6 is a side view in cross-section of another portion of the semiconductor substrate of FIG. 4 and showing details of those portions of the thyristor for providing conduction in a direction opposite to the portions in FIG. 4.

FIG. 6 is a cross-sectional view of semiconductor substrate 100 at a plane where the two thyristors carry current in the opposite direction to that of FIG. 5. Here the regions 175 comprise a common cathode for the two thyristors, and voltage breakover occurs at the junction between region 275 and the semiconductor substrate 100. Again, this voltage breakover may be locally reduced where the thyristors 1000 and 2000 face each other by the addition of region 160 which may for example increase the doping concentration in the semiconductor substrate 100.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor overvoltage protector for limiting the voltage between a first protected wire, a second protected wire and a common wire, comprising:

a first thyristor and a second thyristor facing each other in a common semiconductor substrate, each thyristor having a breakover voltage equal to $V_{BO}$, the voltage protection threshold, and means for firing the second thyristor at a voltage less than $V_{BO}$ in response to breakover firing of the first thyristor.

2. The overvoltage protector of claim 1 wherein the means for firing the second thyristor comprises cross coupling the first and second thyristors by injecting excess carriers into the semconductor substrate.

3. The overvoltage protector of claim 1 wherein the common substrate has a thickness and the first thyristor and the second thyristor have a spacing less than that thickness.

4. The overvoltage protector of claim 1 wherein both the first thyristor and the second thyristor have a locally-reduced breakover voltage where the first thyristor and the second thyristor face each other.

5. The overvoltage protector of claim 4 wherein the locally-reduced breakover voltage is effected by incorporating a doping layer in the region where carrier injection occurs.

6. A balanced overvoltage protector for limiting the voltage between a first protected wire, a second protected wire, and a common wire, comprising:

a first thyristor connected directly between the first protected wire and the common wire, the first thyristor having a breakover voltage equal to $V_{BO}$, the voltage protection threshold, and a second thyristor connected directly between the second protected wire and the common wire, the second thyristor also having a breakover voltage equal to $V_{BO}$, both the first thyristor and the second thyristor being included in a common semiconductor substrate, the second thyristor firing at a voltage less than $V_{BO}$ in response to the breakover firing of the first thyristor.

7. The overvoltage protector of claim 6 where the common substrate has a thickness and the first breakover thyristor and the second breakover thyristor have a spacing less than that thickness.

8. The overvoltage protector of claim 6, where both the first breakover thyristor and the second breakover thyristor have a locally-reduced breakover voltage where the first thyristor and the second thyristor face each other.

9. The overvoltage protector of claim 8 wherein the locally-reduced breakover voltage is effected by incorporating a doping layer in the region where carrier injection occurs.

* * * * *